United States Patent [19]

Doo et al.

[11] 3,796,928

[45] Mar. 12, 1974

[54] SEMICONDUCTOR SHIFT REGISTER

[75] Inventors: Ven Y. Doo; Irving T. Ho, both of Poughkeepsie; Teh-Sen Jen, Fishkill, all of N.Y.

[73] Assignee: International Business Machines Corporation, Armonk, N.Y.

[22] Filed: Nov. 3, 1971

[21] Appl. No.: 195,355

[52] U.S. Cl.... 317/235 R, 317/235 G, 317/235 AH

[51] Int. Cl. ........................................... H01l 19/00

[58] Field of Search........ 317/234 U, 235 B, 235 G, 317/235 WW, 235 AH

[56] References Cited

UNITED STATES PATENTS

| | | | |
|---|---|---|---|
| 3,439,214 | 4/1969 | Kabell | 317/235 |
| 3,570,114 | 3/1971 | Bean et al. | 317/235 |
| 3,403,284 | 9/1968 | Buck et al. | 317/235 |
| 3,633,078 | 1/1972 | Dill et al. | 317/235 |

FOREIGN PATENTS OR APPLICATIONS

| | | | |
|---|---|---|---|
| 2,000,659 | 9/1969 | France | 317/235 |

*Primary Examiner*—Jerry D. Craig
*Attorney, Agent, or Firm*—Wolmer J. Stoffel

[57] ABSTRACT

A semiconductor bucket brigade shift register having a plurality of cells, each cell embodying a transistor and a large capacitance element coupled across the base and the collector contacts of the transistor. Each cell, includes a first layer of insulating material bonded to the surface of the semiconductor body, a second layer of polycrystalline silicon overlying the first layer, a third layer of insulating material over the second layer, emitter, base, and collector contacts to the body of semiconductor material extending through the first, second, and third layers and insulated from the second layer, an electrical connection between the base contact and the second layer of polycrystalline material, and a relatively large surface area of a conductive layer in contact with the collector contact overlying at least in part the second layer.

7 Claims, 6 Drawing Figures

SEMICONDUCTOR SHIFT REGISTER

BACKGROUND OF THE INVENTION

1. Field of Invention

This invention relates generally to monolithic integrated semiconductor structures, and more particularly to a monolithic device capable of storing a sequence of electrical pulses known as an integrated bucket brigade shift register.

2. Description of the Prior Art

Bucket brigade circuits are known which utilize either field effect or bipolar transistors associated with a charge storage capacitor. In the bipolar type cell the storage capacitance is located between the collector and the base of the switching transistor. The delay line circuit is a series connection of transistors with the capacitance obtained with enlarged parasitic Miller capacitance which is easily obtained in integrated circuit form. The delay line uses two complementary clock signals with a frequency equal to the sampling frequency applied to the input signal. The performance of the circuit is, among other things, depending on the interaction between successive signal samples proceeding along the capacitor chain.

In the design and fabrication of the bipolar type cell, the capacitance connected across the collector and base should be relatively large and the cell leakage small. In integrated circuit technology, it is important that the area occupied by each cell, be a minimum and that the yield be as high as possible.

In a field effect transistor type bucket brigade shift register a plurality of FET devices are joined in series with relatively large capacitance provided between the gate and source drain connection. As in the bipolar shift register the capacitor should be relatively large and have minimal leakage.

Capacitance is directly proportional to plate area and inversely proportional to dielectric thickness. The designer in achieving the necessary capacitance is therefore faced with the choice of either making a relative large area capacitor, which is objectionable because it limits the cell density, or reducing the thickness of the passivating layer between the electrode and the semiconductor. The thinner layer is more prone to pin holes and breakdown. This would materially decrease the yield of such an integrated circuit device.

SUMMARY OF THE INVENTION

An object of this invention is to provide an improved bucket brigade shift register.

Another object of this invention is to provide an improved capacitor structure particularly adaptable to bucket brigade shift registers which has a relatively high capacitance and low leakage without increasing the overall area of the cells.

Yet another object of this invention is to provide an improved capacitor structure in an integrated circuit device utilizing a polysilicon layer underlying an enlarged area electrode.

In accordance with the aforementioned objects, the structure of the improved shift register of the invention utilizing bipolar or field effect transistors associated with a capacitor element has a layer of doped polycrystalline semiconductor overlying a major portion of the cell surface area separated from the underlying semiconductor body by a suitable insulating layer, apertures through the polycrystalline layer, and metallurgy overlying the polycrystalline layer, which makes contact to the various elements of the underlying transistor, and a suitable insulating layer separating the metallurgy layer from the polycrystalline semiconductor layer. Preferably the collector terminal of the transistor has a relatively large surface area overlying the polycrystalline layer in the bipolar register. The same basic capacitor structure is equally applicable to field effect transistor bucket brigade shift registers. In this application the polycrystalline layer is the gate, and the overlying metal layer is in ohmic with the source-drain region.

BRIEF DESCRIPTION OF THE DRAWINGS

The foregoing and other objects, features, and advantages of the invention will be apparent from the following more particular description of preferred embodiments of the invention as illustrated in the accompanying drawings.

DESCRIPTION OF THE PREFERRED EMBODIMENT

Figure 1:
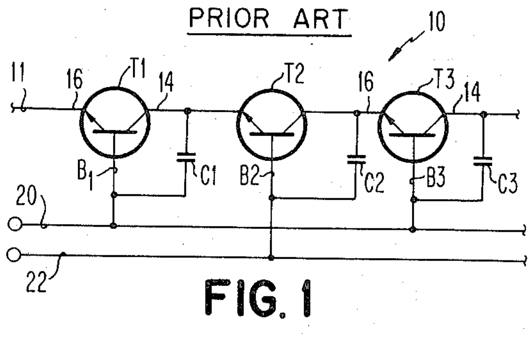
FIG. 1 is a schematic diagram of the circuit arrangement of the bipolar bucket brigade shift register.

Referring now to the drawings, and FIG. 1 in particular, there is illustrated the schematic view of a typical bucket brigade shift register utilizing a bipolar transistor as the switching element. The circuit 10 has a plurality of transistors T1, T2, T3 connected in series with the collector 14 of each connected directly to the emitter 16 of the adjacent transistor. The bases B1, B2, and B3 of alternate transistors are connected to clock lines 20 and 22. Capacitors C1, C2 and C3 are provided, with each respective capacitor connected across the collector and base of the transistor associated with each cell.

The basic theory of the bucket brigade cirucit is well known. A typical publication which describes the theory is contained in an article entitled "Bucket Brigade Electronics — New Possibilities for Delay, Time-Access Conversion and Scanning" by Sangster and Teer, IEEE Journal of Solid-State Circuits, June 1969, pp. 131–136. Very basically the general principle involved in the bucket brigade circuit is that the signal to be delayed is sampled and stored in a cascade of capacitors interconnected by switches operated at the same frequency as the signal sampler. In operation, the base of the first transistor B1 is pulsed up through clock line 20 like all other odd transistors in the array. The Base emitter junction is conducting if the input electrode 11 is at a low voltage state which represents an input signal of "0." Under these conditions an electric current will flow from C1 into 11. If the input signal is "1" which indicates that input electrode 11 is at a high voltage state, the transistor, T1, remains off. Positive charges at C1 under these conditions will remain stored. In an analog application, the input signal at 11 may assume some intermediate voltage levels between the "1" and "0." The charge transfer from C1 to 11 through T1 will be inversely proportional to the voltage level of the input signal. In so doing, the input information is transferring from electrode 11 to capacitor C1, which is the opposite direction of the positive charge transfer. By the same process in the second half of the same cycle when clock-line 22 is pulsing up, the information is transferring from C1 to C2 while positive charges are transferring from C2 to C1. These positive charges, which represent information, start originally at the last capacitor C2n of an n-bit shift register by any charging circuitry. They will be discharged eventually at the input electrode 11. For a very long shift register, it may be divided into several sections of n-bit long where *n* is no larger than a few hundred stages. A refreshing or charge-amplifier circuitry is inserted between adjacent sections.

Figure 3:
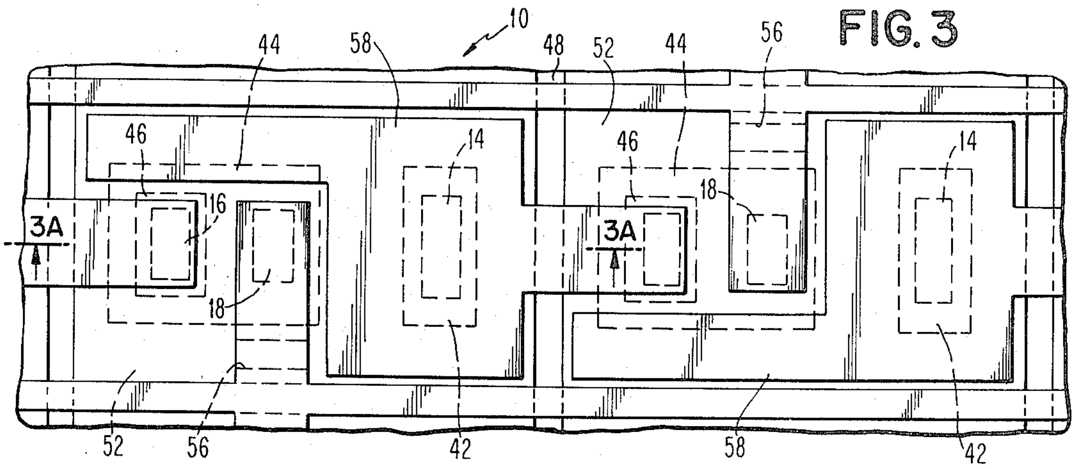
FIG. 3 is a top plan view illustrating the arrangement of the shift register of the invention.
Figure 3A:
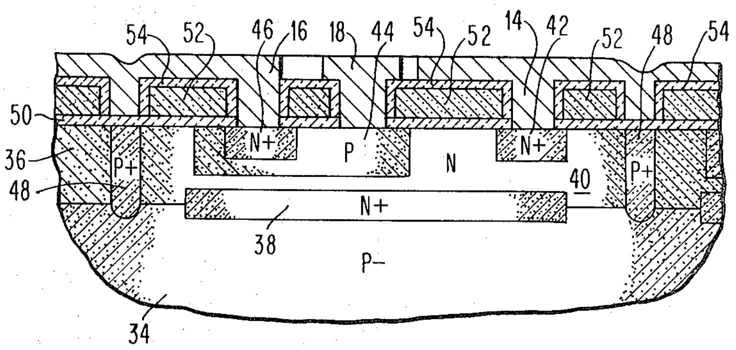
FIG. 3A is an elevational view in broken cross-section taken on line 3A of FIG. 3.

Referring now to FIGS. 3 and 3A there is depicted the specific cell structure of the invention for use with the bucket brigade shift register 10 or delay cell. The device structure is supported on a monocrystalline semiconductor base 34. The transistor is fabricated into an epitaxial layer 36 in the conventional manner having a high conductivity subcollector region 38, a collector region 40, a collector contact region 42, a base region 44, and an emitter region 46. Each transistor is isolated from the surrounding cells by a P+ diffused region 48 which surrounds the transistor. Alternately, regions 48 could be of dielectric material. The surface of the semiconductor is covered by an insulating layer 50 which is typically a layer of thermal $SiO_2$ or alternately a layer of $SiO_2$ and an overlying layer of $Si_3N_4$, provided with contact openings for the terminals of the transistor. An overlying layer 52 of doped polycrystalline material overlies layer 50 as best illustrated in FIG. 3A of the drawing. Layer 52 is insulated from the overlying metallurgy by a relative thin layer of thermally grown $SiO_2$ 54 preferably having a thickness in the range of 1,000 to 2,000 Angstroms. Openings are made through the layer 52 for emitter, base, and collector contact 16, 18, and 14 respectively, as best illustrated in FIG. 3 polysilicon layer 52 overlies the major surface area of the device. An opening 56 through layer 54 provides electrical contact between the layer 52 and the base terminal 18. The opening 56 is illustrated in FIG. 3. The collector contact 14 is provided with a portion 58 of relatively large area which in turn overlies layer 52 at least in part. In the layout of the device it is most convenient to arrange the base leads so that they alternately project transversely from opposite sides of each cell as indicated in FIG. 3. As indicated in FIG. 1 the bases of the transistors are alternately connected to two clock lines 20 and 22. The clock lines in the device are metallurgy stripes located preferably between the rows of cells over the diffused junction isolation region 48. Each clock line can thus serve two adjacent rows of cells. With the layout depicted, a single level of metallurgy is adequate because there is no need for cross-overs.

Figure 2:
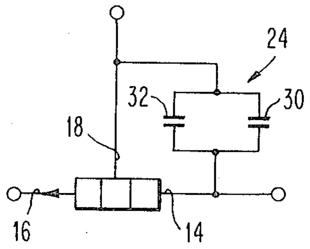
FIG. 2 is a schematic circuit diagram of a single cell of a bucket brigade shift register illustrating the arrangement of the capacitances between the base and collector.

In FIG. 2 is depicted schematically the capacitor relation between the various elements in the individual bucket brigade cell. As indicated the total capacitance 24 consists of a capacitance 32 between the enlarged portion of collector terminal 58, and the polycrystalline layer 52 connected to base terminal 18 of the transistor, in parallel with capacitance 30 between the collector region 40 and the polysilicon layer 52 in direct contact with base terminal 18.

In a typical bucket brigade shift register cell the capacitor size will normally be in the range of one-half to 2 pico farads. The dielectric layer, namely $SiO_2$ layer 54 between the polysilicon layer 52 and the collector terminal will normally have a thickness on the order of 1,000 angstroms. In order to achieve the aforementioned capacitance utilizing the aforementioned dielectric thickness, the area of the common conductive layers should be on the order of 2 $mils^2$. Future high density memory devices may require capacitor size to be significantly less, on the order of 0.05 pico farads.

In the fabrication of the device a monocrystalline semiconductor wafer, typically silicon, has a subcollector diffusion made thereon prior to growing the epitaxial layer 36. Subsequently, an $SiO_2$ masking layer 50 is deposited on the wafer surface, the various diffusions made therein and a polycrystalline silicon layer 52 deposited over the layer. The forming of the dielectric layer 54 is preferably by thermal oxidation which produces a relatively thin but impervious layer. The metallurgy can be any suitable metallurgy typically aluminum deposited by evaporation techniques and etched to the desired configuration using standard photolithographic technology.

Figure 4:
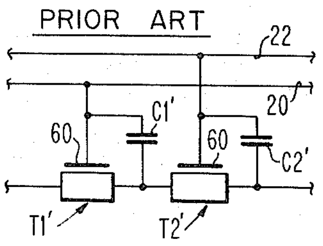
FIG. 4 is a schematic circuit diagram of a FET type shift register.
Figure 5:
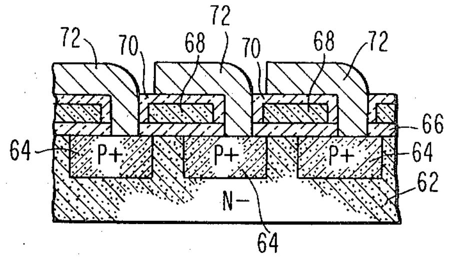
FIG. 5 is an elevational view in cross-section of a preferred embodiment of the FET shift register of the invention.

Referring now to FIG. 4 of the drawings there is depicted a schematic circuit diagram of a bucket brigade shift register utilizing field effect transistors as switching elements. The circuit includes a plurality of field effect transistors T1′ and T2′ connected in series relation with the source of one transistor connected to the drain of the second or adjacent transistor. The gates 60 of the transistors are electrically connected to two clock lines 20 and 22. As indicated alternate gates are connected to each of the clock lines 20 and 22. Capacitors C1′ and C2′ are connected across the gate of each transistor and the source-drain connection. In FIG. 5 is depicted a preferred specific embodiment of the capacitor structure of this invention as it relates to a FET type bucket brigade register. Substrate 62 has a plurality of diffused regions 64 arranged in a column. A layer 66 of insulating material is grown on the surface of substrate 62. Polycrystalline layer elements 68 act as the gates for the field effect transistors and are connected to clock lines 20 and 22 as described previously. Each of the gates 68 overlap the adjacent end regions of diffused regions 64 as indicated in FIG. 5. In operation the adjacent ends of two regions 64 constitute the source and drain of the FET device. Polycrystalline layers 68 are insulated by a layer of insulating material 70, typically thermal $SiO_2$. Extending over layer 68 a layer 72 of conductive material which makes ohmic contact to the diffused region 64. The capacitance associated with each cell of the shift register can be broken into two individual capacitances, namely, a first capacitance consisting of conductive layer 72 serving as one conductive electrode and the polycrystalline layer 68 as the opposite electrode, and a second capacitance consisting of region 64 as one conductive electrode and the polycrystalline layer 68 as the second electrode. As is evident in FIG. 4 the conductive capacitor electrode 72 is ohmic contact with the adjacent source and drain regions of two adjacent FET's. The other conductive capacitor electrode is constituted by doped polycrystalline layer 68 which overlies region 64 and extends well beyond the active gate region. In an application the number of cells in the shift register device can be of any suitable number of merely repeating the structure shown in FIG. 5.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a planar, integrated circuit shift register semiconductor cell structure on a monocrystalline semiconductor body embodying a transistor and a large capacitance element coupled across the base and collector contacts, the improvement comprising;

a first layer of insulating material on the surface of the semiconductor body, a second layer of polycrystalline silicon overlying said first layer of insulating material, a third layer of insulating material over said second layer, emitter, base, and collector contacts to said body of semiconductor material extending through said first, second, and third layers and insulated from said second layer, and electrical connection between said base contact and said polycrystalline silicon layer, and a relatively large surface area of a conductive layer in contact with said collector contact overlying at least in part said second layer.

2. The semiconductor cell structure of claim 1 wherein said third layer of insulating material is a layer of thermal silicon oxide.

3. The semiconductor structure of claim 2 wherein said layer of thermal silicon oxide has a thickness in the range of 1,000 to 2,000 angstroms.

4. The semiconductor cell structure of claim 1 wherein the capacitance between the base and collector contacts of the transistor is in the range of one-half to 2 pico farads.

5. The semiconductor cell structure of claim 1 wherein the transistor is insulated from adjacent cells by a PN junction.

6. The semiconductor cell structure of claim 1 wherein the transistor is at least insulated in part from adjacent cells by dielectric material.

7. In a planar integrated circuit shift register semiconductor structure on a monocrystalline semiconductor body, where each cell of the shift register embodies a field effect transistor and a capacitance element coupled across the gate electrode and the drain region of the field effect transistor, the improvement comprising:

spaced diffused regions in said body, each of said regions serving as a drain region for a first field effect transistor and a source region for an adjacent second field effect transistor, a first layer of insulating material on the surface of the semiconductor body, a second layer of doped polycrystalline silicon overlying said first layer and separated into a plurality of individual areas, each of said areas overlying the gate region of the associated field effect transistor and at least a portion of an associated diffused region, a third layer of thermal silicon oxide insulating material over said second layer, a fourth layer of a conductive material overlying said third layer separated into a plurality of individual areas, each of said areas overlying at least in part an associated individual area of said second layer and in ohmic contact with the respective drain region of the transistor, each of said areas of said second layer operating as a first conductor of a capacitor, the areas of said fourth layer and said drain region of said semiconductor body operating as the second conductor of a capacitor, and the first and third insulating layers serving as a dielectric.

* * * * *